(12) United States Patent
Persson et al.

(10) Patent No.: US 10,931,303 B1
(45) Date of Patent: Feb. 23, 2021

(54) DATA PROCESSING SYSTEM

(71) Applicant: Arm Limited, Cambridge (GB)

(72) Inventors: Erik Persson, Lund (SE); Sven Ola Johannes Hugosson, Lund (SE)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 16/809,086

(22) Filed: Mar. 4, 2020

(51) Int. Cl.
*H03M 7/40* (2006.01)
*G06N 3/04* (2006.01)

(52) U.S. Cl.
CPC ............... *H03M 7/40* (2013.01); *G06N 3/04* (2013.01)

(58) Field of Classification Search
CPC ........ H03M 7/40; H03M 7/4006; H03M 7/46; H03M 7/42; H03M 7/425; H03M 7/30; H03M 7/00; H03M 7/4075
USPC .................................................... 341/67, 107
See application file for complete search history.

(56) References Cited

U.S. PATENT DOCUMENTS

| | | | | |
|---|---|---|---|---|
| 5,396,595 | A * | 3/1995 | Standley | H03M 7/42 341/106 |
| 2007/0262889 | A1 * | 11/2007 | Kuo | H03M 7/40 341/51 |
| 2008/0107349 | A1 * | 5/2008 | Sung | H04N 19/593 382/245 |
| 2008/0253460 | A1 * | 10/2008 | Lin | H03M 7/40 375/240.23 |
| 2009/0096642 | A1 * | 4/2009 | Stein | H03M 7/40 341/51 |
| 2011/0305272 | A1 * | 12/2011 | Moriya | H03M 7/18 375/240 |
| 2015/0358624 | A1 * | 12/2015 | Cheong | H04N 19/176 375/240.24 |
| 2020/0143249 | A1 * | 5/2020 | Georgiadis | H03M 7/607 |

OTHER PUBLICATIONS

Golomb-Rice Coding, https://urchin.earth.li/~twic/Golomb-Rice_Coding.html.

* cited by examiner

*Primary Examiner* — Linh V Nguyen
(74) *Attorney, Agent, or Firm* — EIP US LLP

(57) ABSTRACT

A data processing system is provided including a processing element and a storage. The storage stores code portions that, when executed by the processing element, cause the data processing system to obtain a plurality of variable length codes. Each variable length code has a first portion of a variable length and a second portion. The variable length codes are separated into first portions of the variable length codes and second portions of the variable length codes. The data processing system forms a processed stream in chunks using a set of control rules so that, for each chunk of the processed stream containing data from the first portions of the variable length codes, the data from the first portions forms a sub-stream within the chunk of the processed stream that has a size that is determined in accordance with the control rules.

18 Claims, 13 Drawing Sheets

Divisor = 3

| Value | Quotient | Remainder | GR code |
|---|---|---|---|
| 0 | 0 | 0 | 000 |
| 1 | 0 | 1 | 001 |
| 2 | 0 | 2 | 010 |
| 3 | 1 | 0 | 1000 |
| 4 | 1 | 1 | 1001 |
| 5 | 1 | 2 | 1010 |
| 6 | 2 | 0 | 11000 |
| 7 | 2 | 1 | 11001 |
| 8 | 2 | 2 | 11010 |
| 9 | 3 | 0 | 111000 |
| 10 | 3 | 1 | 111001 |

Fig. 1

|  | balance | wunary | zunary |
|---|---|---|---|
| First chunk | n/a | Up to 12 symbols | fill chunk |
| Subsequent chunk | less than 0 | fill chunk | 0 |
|  | between 0 and 7 | Up to 12 values | fill chunk |
|  | 8 or greater | 0 | fill chunk |

Fig. 13

|  | balance | First values | subsequent values |
|---|---|---|---|
| First chunk |  | unary weight value (up to 12 symbols) | unary zrun values |
| subsequent unary chunks | less than 0 | unary weight values | n/a |
|  | between 0 and 7 | unary weight value (up to 12 symbols) | unary zrun values |
|  | 8 or greater | n/a | unary zrun values |

Fig. 14

DATA PROCESSING SYSTEM

BACKGROUND OF THE INVENTION

Field of the Invention

The invention relates to a data processing system, and more particularly to a data processing system for processing of variable length codes.

Description of the Related Technology

One way of performing lossless data compression that is known in the art is to convert values into Golomb Rice codes. In order to convert a numerical value into a Golomb Rice code a parameter, known as a divisor is selected. To create the Golomb Rice code, the numerical value is divided by the divisor to generate two parts. A first part is the quotient, which is how many times the divisor will divide completely into the numerical value. The second part is a remainder, which is the remaining amount, if any, after dividing the divisor completely into the numerical value.

Examples of Golomb Rice codes are shown in FIG. 1. In the examples shown in FIG. 1, values between 0 and 10 are shown as Golomb Rice codes. The first portion of the Golomb Rice code, the quotient, is represented in unary format. In this format, the number is represented by a number of '1's equal to the quotient value and the followed by a stop bit, which is a '0'. For example, the unary portion of the number 9 is '1110' which is three '1's followed by the stop bit '0' because 3 divides into 9 three times. The second portion of the Golomb Rice code is a fixed length binary portion. As the divisor in this example is '3', the remainder can only be 0, 1, or 2. Accordingly, this can be represented by a fixed length binary of two bits. The last two bits in each of the Golomb Rice codes represents the remainder in binary form. The remainder may be referred to as the 'mantissa' of the Golomb Rice code because it appears after the stop bit of the unary portion of the Golomb Rice code.

As the size of the unary portion of the Golomb Rice code varies, Golomb Rice codes are a type of variable length code. Such variable length codes can be slow to decode in a processor because each code needs to be considered separately for decoding.

SUMMARY

According to a first aspect there is provided a method for use by a processing element, the method comprising: obtaining a plurality of variable length codes, wherein each variable length code has a first portion of variable length and a second portion, separating the variable length codes into first portions of the variable length codes and second portions of the variable length codes; and forming a processed stream in chunks using a set of control rules so that, for each chunk of the processed stream containing data from the first portions of the variable length codes, the data from the first portions forms a sub-stream within the chunk of the processed stream that has a size that is determined in accordance with the control rules.

According to a second aspect there is provided a method of decoding a processed data stream, the method comprising: obtaining a processed data stream containing data relating to a plurality of variable length codes, wherein each variable length code has a first portion of variable length and a second portion and the processed stream is formed in chunks, wherein at least one chunk of the processed stream includes a sub-stream of data formed from first portions of the variable length codes; and identifying and extracting the sub-stream within the chunk of the processed data stream using a set of flow control rules.

According to a third aspect there is provided a data processing system comprising a processing element and a storage, the storage storing code portions that, when executed by the processing element, cause the data processing system to: obtain a plurality of variable length codes, wherein each variable length code has a first portion of a variable length and a second portion, separate the variable length codes into first portions of the variable length codes and second portions of the variable length codes; and form a processed stream in chunks using a set of control rules so that, for each chunk of the processed stream containing data from the first portions of the variable length codes, the data from the first portions forms a sub-stream within the chunk of the processed stream that has a size that is determined in accordance with the control rules.

BRIEF DESCRIPTION OF THE DRAWINGS

The present technique will be described further, by way of example only, with reference to the embodiments as illustrated in the accompanying drawings, in which:

FIG. 1 is a table showing Golomb Rice codes between the values of 0 and 10 using a divisor of 3;

FIG. 13 is a table illustrating flow control rules for encoding unary data relating to weight values; and FIG. 14 is a table illustrating flow control rules for decoding unary data relating to weight values.

DETAILED DESCRIPTION OF CERTAIN INVENTIVE EMBODIMENTS

Figure 2:
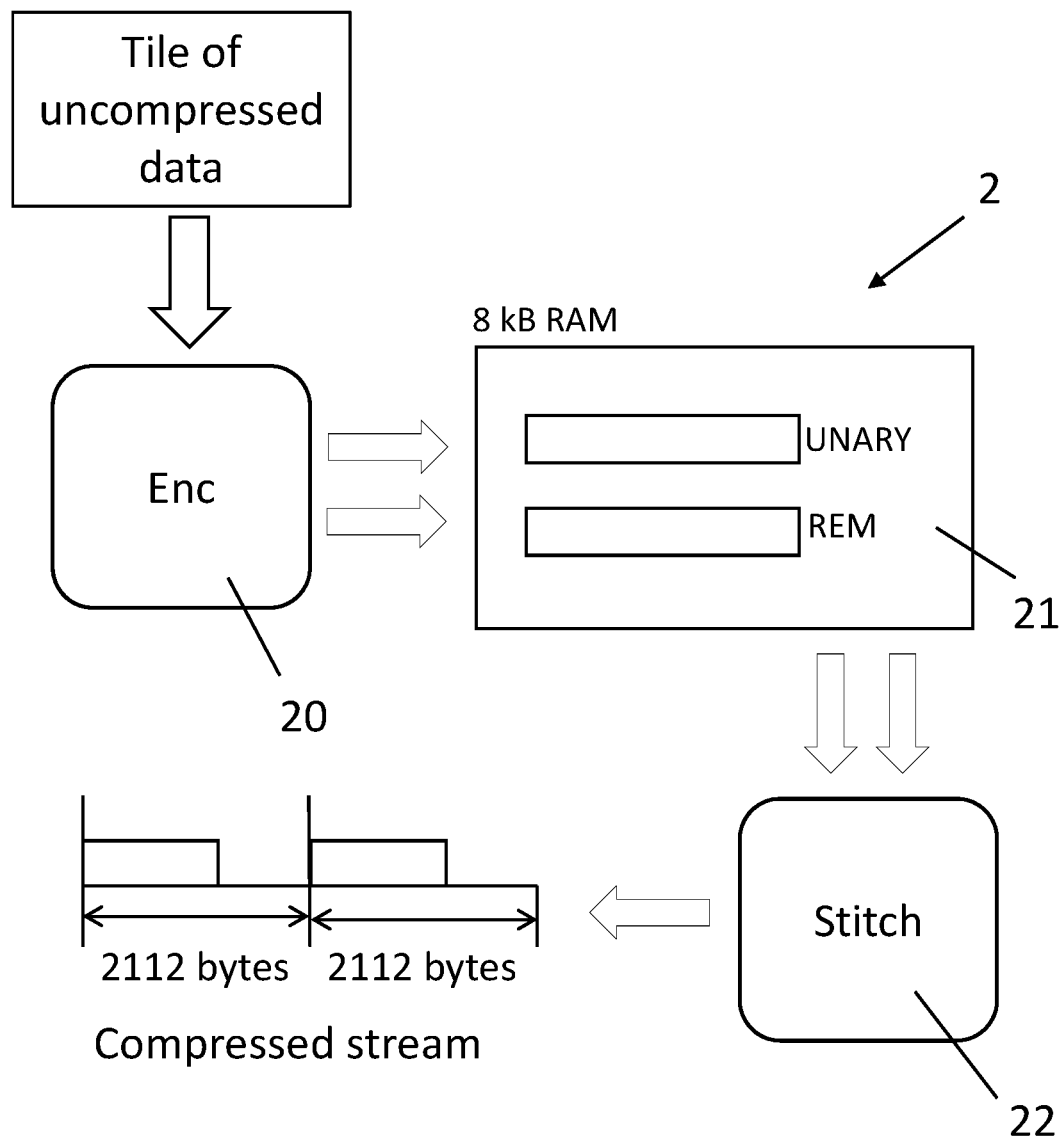
FIG. 2 shows components of a neural processing unit that writes activation data to a storage.

Before discussing the embodiments with reference to the accompanying figures, the following description of embodiments and associated advantages is provided.

In accordance with one embodiment there is provided a method for use by a processing element, the method comprising: obtaining a plurality of variable length codes, wherein each variable length code has a first portion of a variable length and a second portion, separating the variable length codes into first portions of the variable length codes and second portions of the variable length codes; and forming a processed stream in chunks using a set of control rules so that, for each chunk of the processed stream containing data from the first portions of the variable length codes, the data from the first portions forms a sub-stream within the chunk of the processed stream that has a size that is determined in accordance with the control rules. In this way, the processed stream can have a sub-stream of first portions of the variable length codes that is predictable from the control rules. This may enable more efficient processing of the first portions of the variable length codes by a processor.

The first portion of the variable length code may be a unary portion and the second portion of the variable length code may be a mantissa portion. In some cases, the mantissa portion of the variable length code is a truncated binary portion. The unary portion of each variable length code may represent a quotient of an original value represented by the variable length code. Further, in some cases, the mantissa portion of each variable length code is a binary code of fixed length representing a remainder of an original value represented by the variable length code. In some implementations the variable length code is a Golomb Rice code.

Each chunk of the processed stream may include: data from the first portions of the variable length codes and data from the second portions of the variable length codes, data from the first portions of the variable length codes and not include data from the second portions of the variable length codes, or data from the second portions of the variable length codes and not include data from the first portions of the variable length codes.

The control rules may be configured to sequentially determine a size of the unary sub-stream within each chunk. In some cases, the control rules are configured to determine a size of the unary sub-stream in each chunk based on a measure of the unary portions of the variable length codes that remain to be added into the processed stream. For some implementations, the processed stream is formed of cells of a predetermined length and the measure of the unary portions of the variable length codes that remain to be added into the processed stream is the number of bits of the unary portions of the variable length codes associated with a cell that remain to be added into the processed stream. By processing the data in cells, the flow control rules may allow the size of the unary sub-stream to be predicted by a decoder.

The control rules may be rules to select between a predetermined set of chunk structures. Each chunk structure may define the type of data that should go at each position within the chunk. The set of chunk structures may include at least one chunk structure for a first chunk in a cell. The at least one chunk structure for the first chunk in a cell may include a header portion that includes information about data included in the cell.

In some methods according to the first embodiment, the processed stream is formed of cells of a predetermined length, wherein each cell of the processed stream has a header and a plurality of chunks, and wherein the header indicates a length of the cell and a length of the unary portions of the variable length codes within the cell. This may allow a decoder to track the amount of unary data that remains in a cell during decoding.

The first embodiment may further comprise obtaining a second plurality of variable length codes; and separating the second plurality of variable length codes into first portions of the variable length codes and second portions of the variable length codes; wherein the step of forming a processed stream in chunks uses a set of control rules so that, for each chunk of the processed stream containing data from first portions of at least one of the first and second plurality of variable length codes, the flow control rules determine the number of first portions of the first plurality of variable length codes and the number of first portions of the second plurality of variable length codes are included in the chunk.

In some implementations, forming a processed stream includes maintaining a balance value that records a difference between a number of first portions of the first plurality of variable length codes that have been included in chunks and a number of first portions of the second plurality of variable length codes that have been included in chunks and the flow control rules determine the number of first portions of the first plurality of variable length codes and the number of first portions of the second plurality of variable length codes included in a chunk based on the balance value.

In some applications, the plurality of variable length codes represents weight values for use in a neural network. In other applications, the plurality of variable length codes represents values in an activation stream that is an output of a layer of a neural network.

In accordance with a second embodiment there is provided a method of decoding a processed data stream, the method comprising: obtaining a processed data stream containing data relating to a plurality of variable length codes, wherein each variable length code has a first portion of variable length and a second portion and the processed stream is formed in chunks, wherein at least one chunk of the processed stream includes a sub-stream of data formed from first portions of the variable length codes; and identifying and extracting the sub-stream within the chunk of the processed data stream using a set of flow control rules.

In some implementations each first portion of the variable length codes is encoded as unary data having a stop bit. The method may further comprise: obtaining, from a plurality of chunks of the processed data, a plurality of identified and extracted sub-streams; converting each extracted sub-stream into an intermediate form representing a list of bit locations of stop bits within the sub-stream; combining a plurality of the converted sub-streams to form an enlarged list of bit locations; and measuring a distance between the stop bits of the in the enlarged list of bit locations to recover the values of the first portions of the variable length codes in the first stream.

In some embodiments, the flow control rules are configured to determine a size of the unary sub-stream in each chunk to be decoded based on an amount of the unary portions of the variable length codes that remain to be decoded from the processed stream. The processed stream may be formed of cells of a predetermined length and the amount of unary portions of the variable length codes that remain to be decoded from the processed stream may be the number of bits of the unary portions of the variable length codes associated with a cell that remain to be decoded from the processed stream.

In other embodiments, the processed stream may additionally include first portions of variable length codes belonging to a second plurality of variable length codes. The flow control rules may be configured so that, for each chunk of the processed stream to be decoded containing data of first portions of at least one of the plurality of variable length codes and the second plurality of variable length codes, the flow control rules determine the number of first portions of the plurality of variable length codes and the number of first portions of the second plurality of variable length codes are included in the chunk to be decoded.

Identifying and extracting a sub-stream within the chunk of the processed stream may include maintaining a balance value that records a difference between a number of first portions of the plurality of variable length codes that have been extracted from the processed stream and a number of first portions of the second plurality of variable length codes that have been extracted from the processed stream. The flow control rules may be used to determine a number of first portions of the plurality of variable length codes and a number of first portions of the second plurality of variable length codes that should be extracted from a chunk based on the balance value.

In accordance with a third embodiment there is provided a non-transitory computer-readable storage medium storing code portions that, when executed on a processing element, causes the processing element to perform a method of: obtaining a plurality of variable length codes, wherein each variable length code has a first portion of variable length and a second portion, separating the variable length codes into first portions of the variable length codes and second portions of the variable length codes; and forming a processed stream in chunks using a set of control rules so that, for each chunk of the processed stream containing data from the first portions of the variable length codes, the data from the first portions forms a sub-stream within the chunk of the processed stream that has size that is determined in accordance with the control rules.

In accordance with a fourth embodiment there is provided a non-transitory computer-readable storage medium storing code portions that, when executed on a processing element, causes the processing element to perform a method of decoding a processed data stream, the method comprising: obtaining a processed data stream containing data relating to a plurality of variable length codes, wherein each variable length code has a first portion of variable length and a second portion and the processed stream is formed in chunks, wherein at least one chunk of the processed stream includes a sub-stream of data formed from first portions of the variable length codes; and identifying and extracting the sub-stream within the chunk of the processed data stream using a set of flow control rules.

In accordance with a fifth embodiment there is provided a data processing system comprising a processing element and a storage, the storage storing code portions that, when executed by the processing element, cause the data processing system to: obtain a plurality of variable length codes, wherein each variable length code has a first portion of variable length and a second portion, separate the variable length codes into first portions of the variable length codes and second portions of the variable length codes; and form a processed stream in chunks using a set of control rules so that, for each chunk of the processed stream containing data from the first portions of the variable length codes, the data from the first portions forms a sub-stream within the chunk of the processed stream that has a size that is determined in accordance with the control rules.

In accordance with a sixth embodiment there is provided a data processing system comprising a processing element and a storage, the storage storing code portions that, when executed by the processing element, cause the data processing system to: obtain a processed data stream containing data relating to a plurality of variable length codes, wherein each variable length code has a first portion of variable length and a second portion and the processed stream is formed in chunks, wherein at least one chunk of the processed stream includes a sub-stream of data formed from first portions of the variable length codes; and identify and extract the sub-stream within the chunk of the processed data stream using a set of flow control rules.

Particular embodiments will now be described with reference to the Figures.

FIG. 2 shows some, but not all, components 2 of a neural processing unit (NPU), which is a specialized chip for performing calculations in connection with artificial intelligence applications and particularly calculations related to neural networks. In other words, the NPU allows hardware acceleration of certain calculations relating the neural networks. The components 2 are components for writing activation values to a DRAM (not shown) external to the NPU.

When performing calculations relating to a neural network, calculations may be performed for each layer of the neural network. These calculations generate output known as activation data, which can be large in volume and needs to be stored before further calculations can be performed using that data. Storing and retrieving activation data from memory can be a relatively slow process due to constraints on data transfer from external memory to the processor. Accordingly, compressing the data from the activation layer using Golomb Rice codes is desirable in order to improve processor performance.

The components 2 are configured to process activation data for storage. The activation data is received and grouped into tiles of data. A tile of data is defined as an 8×8 group of elements, where an element is 8 bits of the uncompressed activation data. A processing element in the form of an encoder 20 is configured to compress the received activation data by converting the activation data into Golomb Rice codes. Further steps, which will be described below, are then performed to make the activation data easier to decode.

When decoding variable length codes, such as Golomb Rice codes, it is difficult to parse at high rates. This is because there is a serial dependency between Golomb Rice codes, such that the length of the preceding Golomb Rice code needs to be known before the next Golomb Rice code can be identified and decoded. Accordingly, a typical hardware implementation to decode Golomb Rice codes might achieve a rate of 1 or 2 Golomb Rice codes per clock cycle when directly parsing using a single parser.

Figure 3:
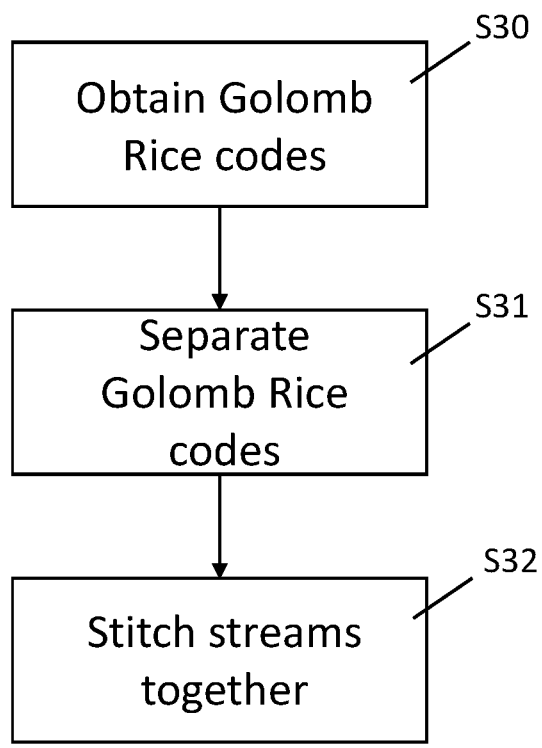
FIG. 3 is a flow chart showing processing of a stream of Golomb Rice codes for storage.

The technique described in the first particular embodiment takes a different approach. FIG. 3 is a flow chart showing steps performed by the encoder 20 that receives uncompressed activation data. In step S30, Golomb Rice codes are obtained, in this case by conversion by the encoder 20. Then, in step S31, the encoder 20 separates the Golomb Rice codes into a stream of unary values and a stream of remainder values and stores them in a RAM 21 shown in FIG. 2.

Figure 4:
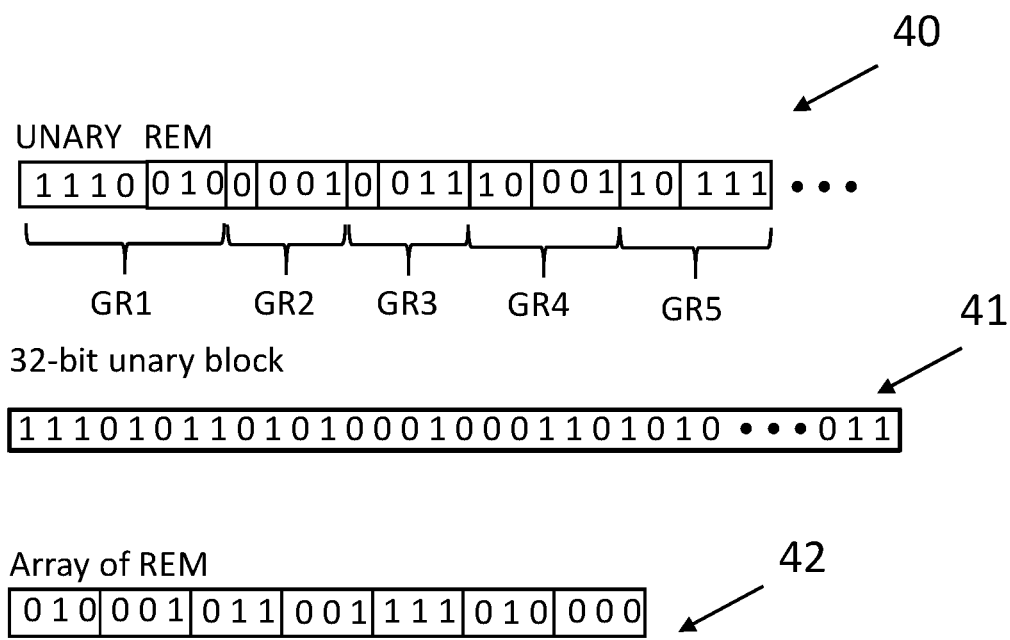
FIG. 4 shows the structure of streams of data during separation of Golomb Rice codes.

FIG. 4 shows three data streams. A source data stream 40 is a stream of Golomb Rice codes. The source data stream 40 includes a series of Golomb Rice codes which are indicated by the values GR1 to GR5. Each Golomb Rice code has a variable length unary part and a fixed length binary part of the type described in the description of related technology. Although a three-bit fixed length binary part is illustrated in FIG. 3, the length of the binary part is not important and other lengths could be used. The encoder 20 divides the Golomb Rice codes into two parts to generate two further streams 41 and 42 shown in FIG. 4. The first stream 41 is a unary stream and the second stream 42 is a stream of remainders, each binary value having a fixed length.

In step S32, a stitch processor 22, shown in FIG. 2, stitches together the first stream and second stream to form a processed stream. This is done on a cell-by-cell basis where each cell represents 32 tiles of uncompressed data (2,048 elements) stored in a 2112 byte slot. The slot is larger than the cell in order to allow some overhead and to round up to a whole number of 64 bytes.

Each cell is formed by the stitch processor 22 in a plurality of chunks. A first chunk of a cell always includes a header. The unary data from the stream 4 is always stitched into the chunks of the processed stream by the stitch processor 22 in portions of 32 bits.

Figure 5:
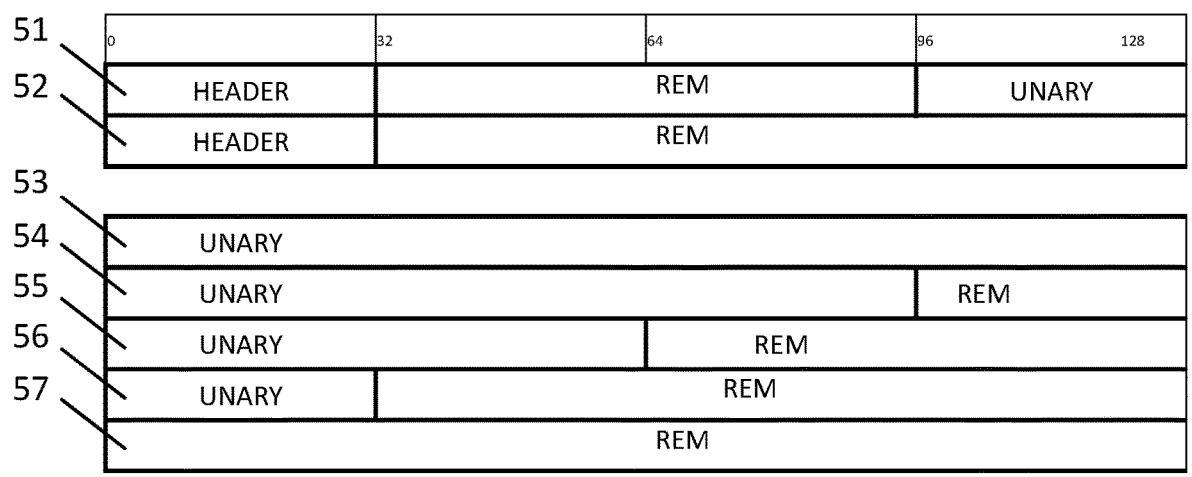
FIG. 5 shows a plurality of chunk structures used by an encoder and a decoder.
Figure 6:
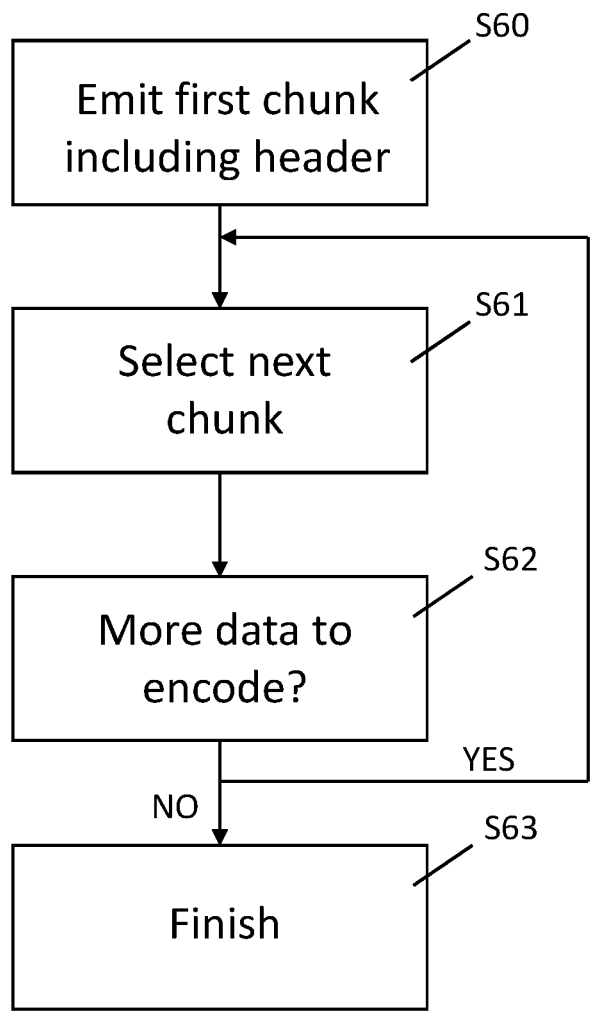
FIG. 6 is a flowchart showing steps performed by the encoder.

The cell is formed by the stitch processor 22 using a set of flow control rules as will now be described with reference to FIGS. 5 and 6. FIG. 5 shows different structures of chunks that the stitch processor 22 may use to form the cell and FIG. 6 shows steps to be performed by the stitch processor 22 when forming a cell.

As mentioned above the first chunk of a cell must include a header, which provides information on the length of the cell and the length of the unary sub-stream included within the cell. The length of the remainder values within the cell is not included in the header but can be derived from the length of the cell and the length of the unary sub-stream.

FIG. 5 shows available chunk formats that have been designed, for parse efficiency, to allow each chunk to be consumed in a single clock cycle of a decoder that decodes the Golomb Rice codes. The chunk structures shown are split into two categories: the top two chunk structures 51 and 52 shown in FIG. 5 are first chunk structures for a cell and can be selected for use when forming a first chunk of a cell. Both chunk format structures include a header portion of 32-bit length. The next five chunk structures 53 to 57, below the first chunk structures 51 and 52 in FIG. 5, are used after the first chunk in cell has been emitted by the encoder 20 to include the remaining unary and remainder data from the first and second streams corresponding to 32 tiles of uncompressed data to be included in the cell.

In order to select an appropriate chunk structure to use, the encoder 20 uses a set of flow control rules. Once a chunk structure for the next chunk has been identified the chunk structure can be populated with the appropriate data and emitted. The flow control rules used by the stitch processor 22 are as follows. When selecting a first chunk structure for a cell, the first chunk structure 51 shown in FIG. 5 is selected if there are more than 32 bits of unary data in the cell available to the stitch processor 22 for inclusion in the chunk. Otherwise, the chunk structure 52 is used to form the first chunk of the cell because the chunk 52 does not require any unary data. A situation in which 32 bits of unary data are not available may arise if none of the uncompressed activation data for a cell has a unary portion i.e. each value is less than the divisor used for generating the Golomb Rice codes. In this case, the encoder 20 does not encode the stop bits as unary data.

For subsequent chunks in the cell emitted by the encoder 20 after the first chunk has been emitted, if there is more than 128 bits of unary data remaining for inclusion in the cell, chunk structure 53 is used. As the unary data is included in the chunks in 32-bit portions, eventually there will be fewer than 128 bits of unary data remaining to be encoded for the cell. If there are 96 bits of unary data remaining to be encoded for the cell then chunk structure 54 is used, if there are 64 bits of unary data remaining to be encoded for the cell then chunk structure 55 is used and if there are 32 bits of unary data remaining to be encoded for the cell then chunk structure 56 is used. In a case where all the unary data of the cell has been encoded then chunk structure 57 is used to emit reminder data. It should be noted that the unary data included in the above chunk structures is selected regardless of the underlying tile and element groupings of the underlying activation data, such that unary data from different tiles and/or elements may be included in the same chunk.

The above method is illustrated in FIG. 6. In step S60 a first chunk structure is selected from chunk structures 51 and 52 shown in FIG. 5. This choice depends on the availability of 32 bits of unary data as described above. After selecting the chunk structure, the stitch processor 22 creates the header portion. The stitch processor 22 evaluates a length of the unary sub-stream to be included in the cell based on the 32 tiles of uncompressed data and adds information indicating that length to the header portion. The length of all data to be included in the cell is also evaluated and added to the header portion. Data from the first stream of unary data 41, if required, and data from the second stream of remainder data is added to the chunk in accordance with the selected chunk structure selected by the stitch processor 22.

In step S61, a next chunk of the processed data stream is formed by selecting appropriate the appropriate chunk structure from chunk structures 53 to 57 in accordance with the flow control rules described above. After selecting the chunk structure, the chunk is formed by filling the relevant portions of the chunk structure with data from the first stream of unary data 41 and data from the second stream of remainder data.

In step S62, the stitch processor 22 determines whether there is more data to be formed into chunks. If there is more data to be formed into chunks the method proceeds to S61 to form the next chunk. If there is no more data to be processed, the method proceeds to S63 where it finishes.

The above described method assumes that complete 128-bit chunks can be formed from the 32 tiles in a cell and that the unary portions can be stitched into 32-bit portions. In practice these conditions may not be met, in which case the first stream of unary portions and second stream of remainder portions are padded using the stop bit '0' for padding until they reach the desired size. As the length of data added to the cell is stored in the header it is possible to identify the length of the data within the cell and identify where the padding starts when decoding the processed data stream.

Figure 7:
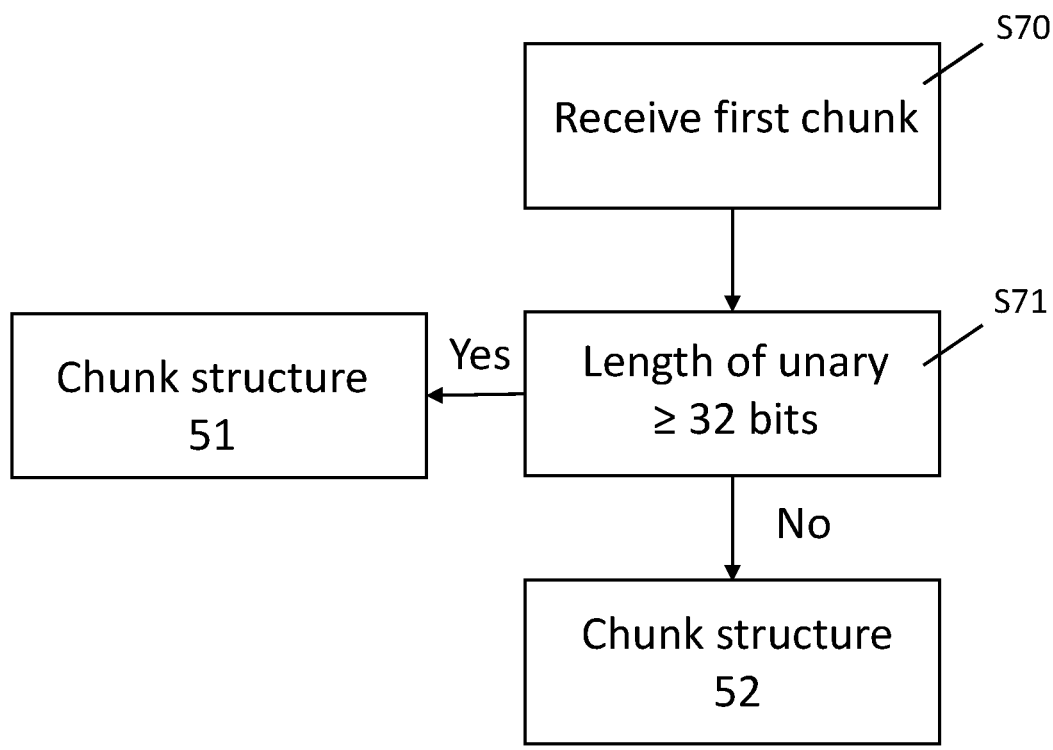
FIG. 7 is a flow chart showing steps for deciding a chunk structure when decoding a first chunk of a stream encoded by the encoder.

Next a method of decoding the stored activation data by a decoder will be described with reference to FIGS. 7 and 8. In this case, the decoder is a part of the NPU that allows activation data to be read from the DRAM for use in further calculations. The decoder stores a copy of the chunk structure shown in FIG. 5 that was used by the encoder 20 to store the processed stream in the RAM. In step S70 of FIG. 7, the decoder receives a first chunk of a cell of activation data for decoding from the RAM. The decoder reads the header and identifies the length of unary data in the cell. In step S71, the decoder identifies whether the length of unary data specified in the header is 32 bits or more. If the length of unary is 32 bits or more then the first chunk of the cell is formed according to chunk structure 51 and the unary and remainder data can be extracted from the chunk in accordance with the known chunk structure. If the length of the unary data identified in the header is less than 32 bits (zero, because the unary data is stitched in 32-bit portions), the first chunk is formed according to chunk structure 52 and the first chunk is decoded accordingly. When decoding data, the decoder maintains a parameter U_left, which is initially set to the value of the length of unary in the cell when the header of a cell is examined and is updated each time unary data is retrieved from a chunk to record an amount of unary data remaining in the cell. Accordingly, if chunk structure 51 is used for the first chunk then the parameter U_left will be reduced by 32 after extracting 32 bits of unary data from the first chunk.

Figure 8:
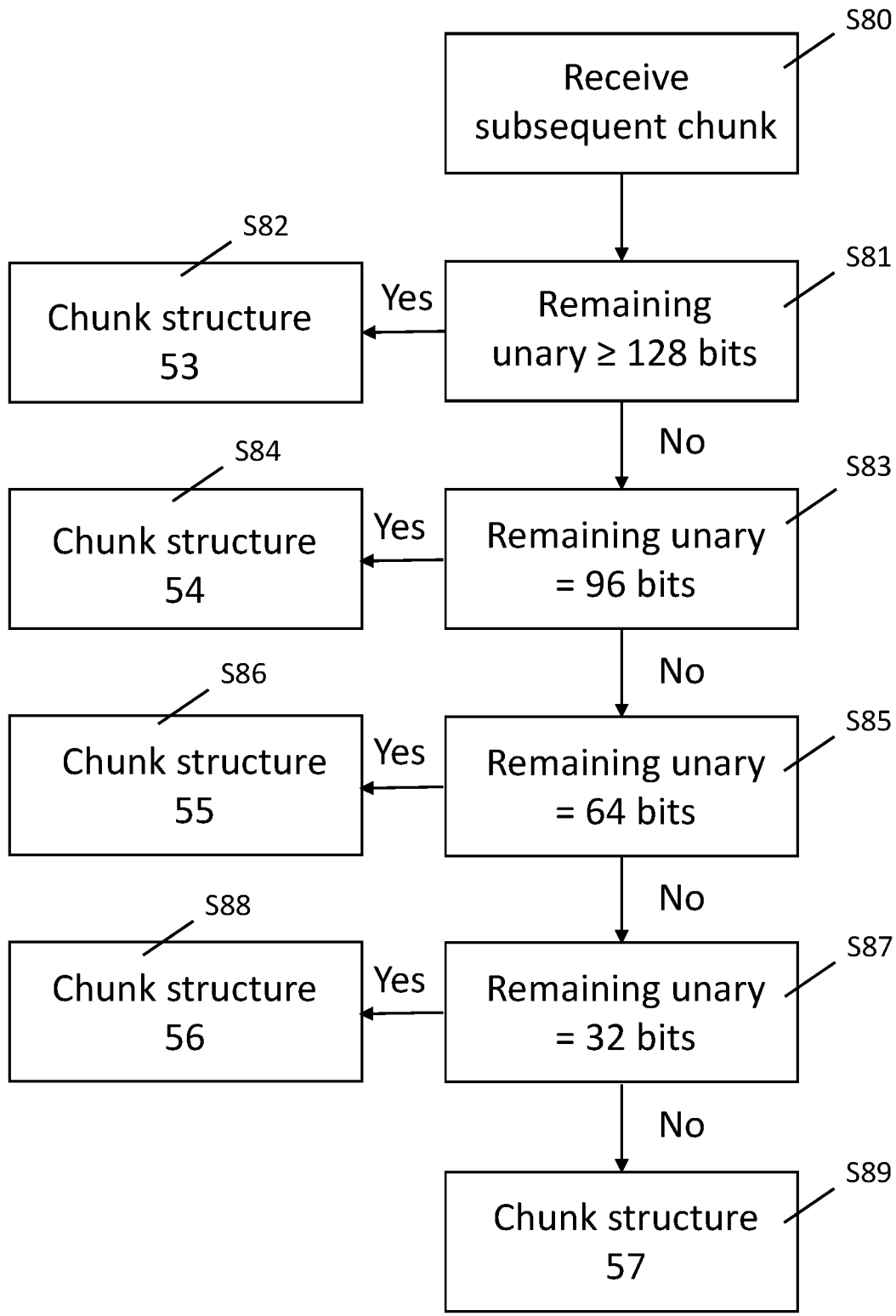
FIG. 8 is a flow chart showing steps for deciding a chunk structure when decoding subsequent chunks of a stream encoded by the encoder.

FIG. 8 shows a method used by the decoder for determining the chunk structure for each subsequent chunk. In step S80 a subsequent chunk of the stored activation data is received. In step S81, the parameter U_left is examined to determine if the amount of unary data remaining to be extracted for the cell is greater than or equal to 128 bits. If the amount of unary data to be extracted is greater than or equal to 128 bits, the decoder determines that chunk structure 53 is being used. In step S82, the decoder extracts data from the chunk in accordance with chunk structure 53 and updates the parameter U_left to account for the amount of unary data extracted.

If less than 128 bits of unary data remains to be extracted, the method proceeds to step S83. In step S83, the parameter U_left is examined to determine if the amount of unary data remaining to be extracted for the cell is equal to 96 bits. If the amount of unary data to be extracted is equal to 96 bits, the decoder determines that chunk structure 54 is being used. In step S84, the decoder extracts data from the chunk in accordance with chunk structure 54 and updates the parameter U_left to account for the amount of unary data extracted.

If less than 196 bits of unary data remains to be extracted, the method proceeds to step S85. In step S85, the parameter U_left is examined to determine if the amount of unary data remaining to be extracted for the cell is equal to 64 bits. If the amount of unary data to be extracted is equal to 64 bits, the decoder determines that chunk structure 55 is being used. In step S86, the decoder extracts data from the chunk in accordance with chunk structure 55 and updates the parameter U_left to account for the amount of unary data extracted.

If less than 64 bits of unary data remains to be extracted, the method proceeds to step S87. In step S87, the parameter U_left is examined to determine if the amount of unary data remaining to be extracted for the cell is equal to 32 bits. If the amount of unary data to be extracted is equal to 32 bits, the decoder determines that chunk structure 56 is being used. In step S86, the decoder extracts data from the chunk in accordance with chunk structure 56 and updates the parameter U_left to account for the amount of unary data extracted. If the amount of unary data to be extracted is not equal to 32 bits (it is equal to zero), the decoder determines that chunk structure 57 is being used. In step S89, the decoder extracts data from the chunk in accordance with chunk structure 57.

Based on the process described above in connection with FIGS. 7 and 8, the decoder can efficiently recreate the first stream of unary data 41 and the second stream of remainder data 42 from the processed stream of data stored in the RAM by the encoder 20. By using the flow control rules shown in FIGS. 7 and 8 the decoder can decide on the type of data that will be found at any point in an incoming stream without a bit cost of indicating the data type within the incoming compressed data stream.

Having extracted the unary and remainder data from the processed data stream, the decoder needs to decode the Golomb Rice codes to recreate the uncompressed activation data. The second stream 42 of remainder data is an array of fixed length binary values and is straightforward to decode using techniques known in the art. Accordingly, this process is not discussed further here.

Figure 9A:
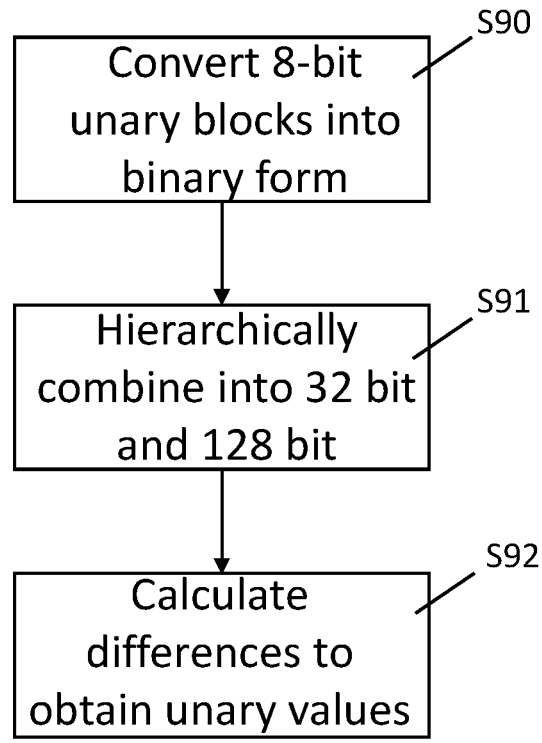
FIG. 9a is a flow chart showing steps for decoding unary data.

Decoding the first stream of unary data 41 is described now in connection with FIG. 9a. In a step S90, 8-bit blocks of the unary data are converted into a binary form in which the binary form indicates the position or positions of stop bits within the binary block. This is done by use of a look-up table. In step S91, as unary codes may span across 8-bit blocks, four 8-bit blocks are combined into a 32-bit block and then four 32-bit blocks are combined into a 128-bit block. The 128-bit block is again a list of positions of stop-bit locations. To retrieve the unary values, in step S92, a difference is taken between the values of each neighboring stop-bit location which gives the value of the unary code.

Figure 9B:
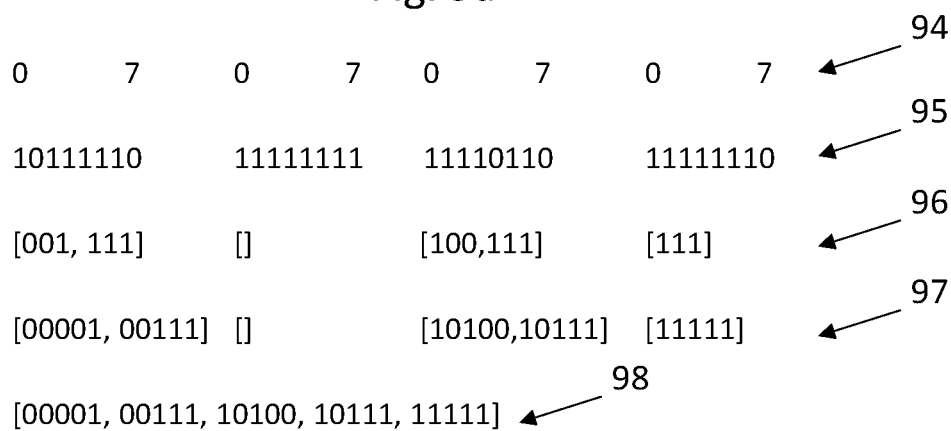
FIG. 9b illustrates bit processing when decoding a collection of unary values.

The method of FIG. 9a may be achieved by using a look-up table to analyze 8-bit blocks of unary data into an intermediate form. This is illustrated in FIG. 9b in which the top row 94 identifies bit positions within each byte illustrated below it. The first bit in each byte is bit '0' and the last bit is bit '7'. The second row 95 shows the bytes of unary data. It is recalled that the stop bits in the unary data are '0'. In the intermediate form, shown in third row 96, each byte is expanded into a list of up to eight 3-bit codes indicating the location of the stop bit within the byte. A Radix-4 combination of four 8-bit segments into 32-bit segments is performed and illustrated in the fourth row 97 and fifth row 98 of FIG. 9b. In the fourth row 97 a pair of identifying bits are added as most significant bits (MSB) to the codes. For the first byte, the values '00' are added to the 3-bit code, for the third byte the values '10' are added to the 3-bit code etc. In the fifth row the 5-bit codes are concatenated to form a list of stop-bit positions within a 32-bit word. A subsequent Radix-4 combination of four 32-bit segments into 128-bit segments generates a list of 7-bit codes indicating locations of unary stop bits using a similar process. As in step S92, subtraction of adjacent values yields the lengths, and hence values, of the unary data.

As described above, the first particular embodiment combines unary and remainder portions of Golomb Rice codes within cells. Each cell can include both unary and remainder portions. This mixing the unary and remainder portions of the activation data within cells has an advantage of spreading unary portions and remainder portions across the processed data stream retrieved from the DRAM. This allows a parse buffer at the decoder for storing unary data before decoding to be reduced in size, thereby reducing hardware requirements.

Figure 10A:
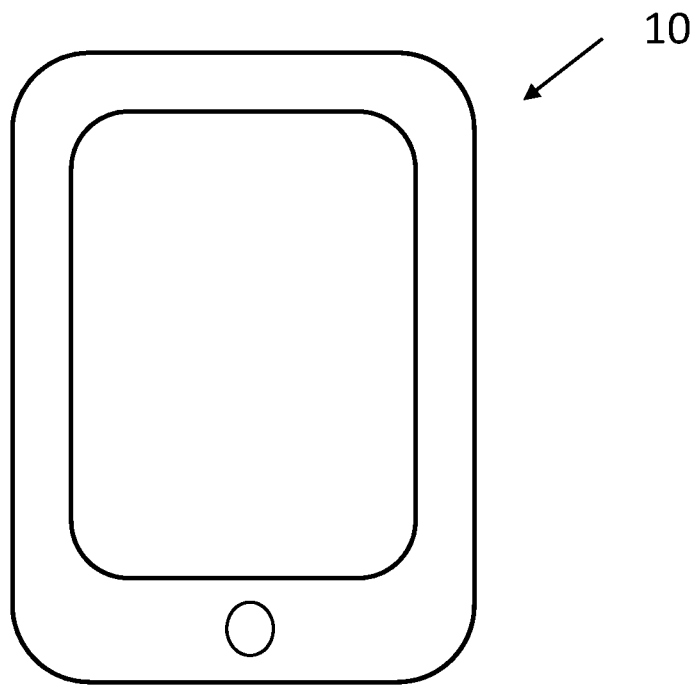
FIG. 10a illustrates a mobile device.
Figure 10B:
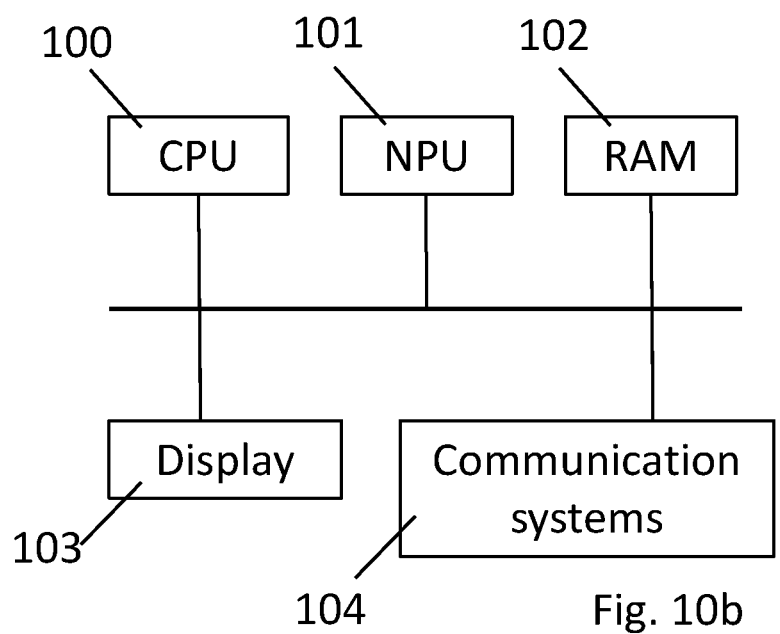
FIG. 10b is a diagram showing hardware of the mobile device.

In the first particular embodiment, the compression of activation data was discussed. In a second particular embodiment the technique is applied to the compression of weight values. FIG. 10a shows a mobile device 10 of the second particular embodiment. Although a mobile device 10 is described herein, the techniques described may be applied to any type of computing device that retrieves weight values associated with neural networks including, without limitation, tablet computers, laptop computers, personal computers (PC), servers, etc. FIG. 10b shows hardware of the mobile device 10. The mobile device 10 includes a processing element in the form of a CPU 100 and a specialized processor 101 in the form of a neural processing unit (NPU). The mobile device 10 additionally includes storage in the form of random-access memory (RAM) 102. Additional non-volatile storage is also provided, but not illustrated in FIG. 10b. The mobile device 10 includes a display 103 for displaying information to a user and communications systems 104 to allow the mobile device 10 to connect to transfer and receive data over various data networks using technologies such as Wi-Fi™ and LTE™.

Figure 11:
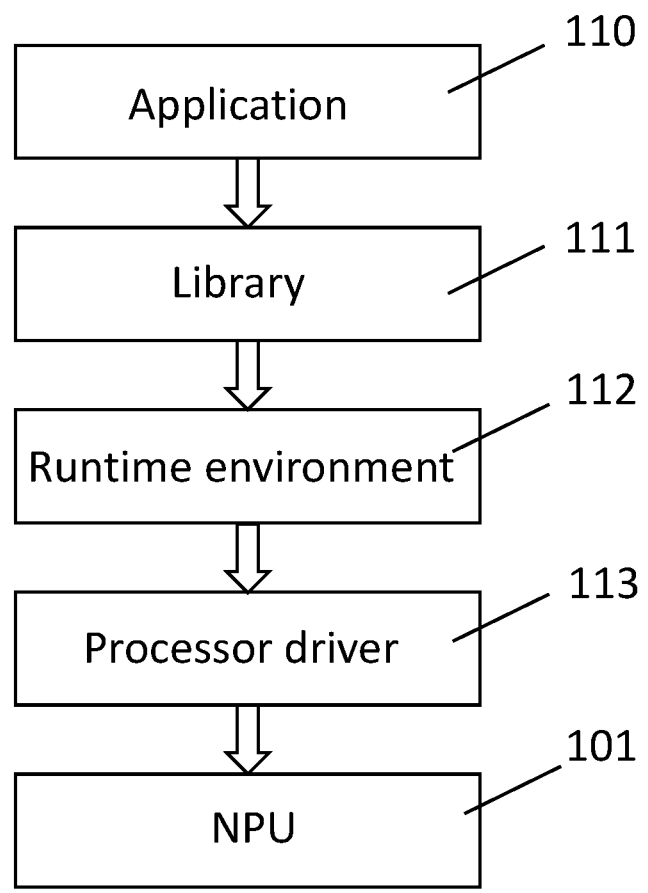
FIG. 11 is a diagram showing a system architecture installed on the mobile device.

FIG. 11 shows a system architecture installed on the mobile device 10 associated with the NPU 101. The system architecture allows a software application 110 to access the NPU 101 for hardware acceleration of calculations relating to neural networks. The system architecture is an Android® software architecture, for use on a mobile telephone, tablet computer or the like.

The software application 110 has been developed to make use of a machine learning library 111 for hardware acceleration of certain processes in relation to neural network processing. A runtime environment 112 is provided below the library, known as Android® Neural Networks Runtime which receives instructions and data from the application 110. The runtime environment 112 is an intermediate layer that is responsible for communication between the software application 110 and the NPU 101 and scheduling of execution tasks on the most suitable hardware. Beneath the runtime environment 112 there is provided at least one processor driver and an associated specialized processor, in this case the NPU 101. There may be multiple processor processors and associated drivers provided beneath the runtime environment 112, such as a digital signal processor, a neural network processor and a graphics processor (GPU). However, in order to avoid redundant description, only the NPU 101 and associated processor driver 113 will be described in connection with the second particular embodiment.

Figure 12:
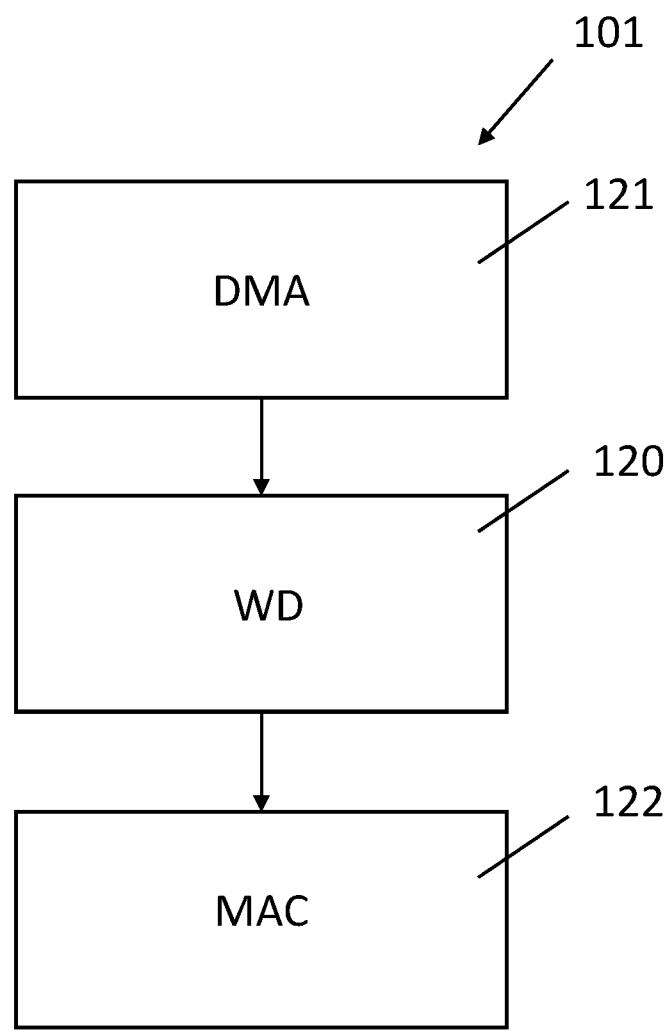
FIG. 12 is a diagram showing components of a neural processing unit.

FIG. 12 shows subcomponents of the NPU 101. The NPU 101 includes a weight decoder 120 connected to a direct memory access component 121 that handles data transfers on an external interface to the RAM 102 of the mobile device 10. Decoded values from the weight decoder 120 are sent to a multiplier accumulator unit 122 for subsequent processing by the NPU 101.

In the second particular embodiment, the processor driver 113 stores weight values in the RAM 102 according to a chunk structure determined by a set of flow control rules. Subsequently, the direct memory access component 121 retrieves the weight values from the RAM 102 and the weight decoder 120 extracts data from the chunk structure.

The processor driver 113 obtains a set of uncompressed (raw) weight values for a neural network. The source of the uncompressed weight values does not matter for the purposes of the techniques discussed here. However, in one example, the uncompressed weight values may be provided to the Android Neural Networks Runtime by the application 110.

The weight values are received in an uncompressed format, such as binary data. A first step performed by the processor driver 113 is zero-run coding. Zero-run coding is beneficial if weight values with value 0 are frequent in the weight stream. For a sequence of weight values which includes n non-zero weight values, an array of weight values (weight values) is formed by the processor driver 113 as the sequence of non-zero weight values. The processor driver 113 also identifies an array of zero run lengths between the non-zero weight values (zruns). The array of zero runs has a length of n+1. In the sequence of zruns, zruns[0] is the initial zero run length and zruns[n] is the ending zero run.

For example, consider the following weight sequence: 0, 5, 6, 0, 0, 0, 7, 0. The processor driver 113 would code n=3, because there are 3 non-zero values. The sequence of weight values is: weight_values={5, 6, 7} and the sequence of zero runs is zruns={1, 0, 3, 1}. From these two sequences the original weight sequence can be reconstructed. In this way, the processor driver 113 separates the incoming stream of weight values into a sequence of weight_values and a sequence of zruns.

The weight_values are converted to Golomb Rice codes using a first divisor and the zruns are converted into Golomb Rice codes using a second divisor. In the same way as the first particular embodiment, the Golomb Rice codes are separated by the processor driver 113 into unary and reminder streams. Accordingly, the processor driver 113 generates four different data streams to be included in chunks for storage in RAM 102: unary portions of the weight_values (wunary), remainder portions of the weight values (wremain), unary portions of the zruns (zunary), and remainder portions of the zruns (zremain). These different data types are added to a chunk structure using a set of flow control rules as described below.

The weight values received by the processor driver 113 are coded in slices, with a slice header at the beginning of each slice. The slice header includes information about the divisor used to create the weight_value Golomb Rice codes and the divisor used to create the zrun Golomb Rice codes. The slice header also includes information about the length of the slice. After the slice header follows a number of chunks that encode the different data types mentioned above. The chunks alternate between including unary values and remainder values, with the remainder values (wremain and zremain) being included in the chunk after the chunk containing the corresponding unary values (wunary and zunary). Each chunk encoding unary values (wunary and zunary) encodes a maximum of 12 weight symbols and 12 zero run symbols (each symbol corresponding to a first portion of a Golomb Rice code). The reason that the number varies is that the unary values corresponding to a symbol are of variable length and fewer unary values can be encoded if the lengths of the symbols are long than a case in which the lengths of the symbols are short. The length of the unary chunk has a maximum predefined value, which is selected based on characteristics of the decoder. The chunks that follow the unary data and include the remainder values are of variable length because, as mentioned above, they include the remainder values corresponding to the unary symbols included in the preceding chunk.

For the chunks including unary data, the addition of unary values is controlled by keeping track of a balance that is the number of wunary values added to chunks in a slice so far minus the number of zunary values added to chunks in a slice so far. If the balance is greater than or equal to 8 then only zunary values are included in the next unary chunk. If the balance is less than 0 then only wunary values are added to the next unary chunk.

To form a first chunk including unary data, up to 12 symbols worth of wunary values are added to the chunk as long as the maximum chunk size is not exceeded. The remainder of the chunk is then filled with zunary values corresponding to zrun symbols. The second chunk includes remainder values (wremain and zremain) associated with the unary portions of the symbols added to the first chunk. When forming a third chunk there are three possibilities. Firstly, if the balance described above, is between 0 and 7, then the same process as for the first chunk is followed with up to 12 symbols of the wunary data added to the chunk followed by filling with zunary values corresponding to zrun symbols. Secondly, if the balance is greater than or equal to 8, then the chunk is filled with zunary values only. This allows the zunary values to catch up if more wunary values have been encoded. Thirdly, if the balance is less than 0 then the chunk is filled with only wunary values. This allows the wunary values to catch up if more zunary values have been encoded. The fourth chunk includes the remainder values corresponding to the symbols included in the third chunk. The logic of the flow control rules described above is illustrated in FIG. 13. This process continues until all the data for the slice has been encoded.

Sometime later, the weight data is retrieved for use in the weight decoder 120 by the direct memory access component 121. The weight decoder 120 identifies the extracts values from the stream of processed data retrieved by the direct memory access component 121 as follows. The logic for decoding the chunks is shown in FIG. 14. As with the previously described encoding, a balance value is maintained by the weight decoder 120. The balance value at the weight decoder 120 is the number of wunary values extracted from chunks in a slice so far minus the number of zunary values extracted from chunks in a slice so far.

In the first chunk to be decoded, the weight decoder 120 starts extracting wunary values until either all the data from the chunk has been extracted or 12 symbols worth of wunary values have been extracted. Subsequent values in the first chunk are extracted as zunary values.

As discussed in connection with encoding, the chunk following a unary chunk includes remainder values corresponding to the symbols in the preceding chunk. The number of symbols worth of wunary values in the preceding chunk is known. Accordingly, the same number of wremain values corresponding to the wunary values in the preceding chunk are extracted and any subsequent values are extracted as zremain values. For subsequent unary chunks, the balance is examined. If the balance is less than zero, the weight decoder 120 extracts all the unary values as wunary values. If the balance is 8 or greater, the weight decoder extracts all the values as zunary values. If the balance is between 0 and 7 the first unary data up to 12 symbols are extracted as wunary values and any subsequent values are extracted as zunary values.

In this way the weight decoder 120 can extract the unary and reminder portions of both zrun and weight sequence data without a bit cost in the stream of data to identify the type of data.

The extracted zrun and weight sequence data are subsequently decoded to recovery the underlying weight values. Decoding of unary and remainder portions of Golomb Rice codes was discussed in connection with the first embodiment and that description is not repeated here.

The above embodiments are to be understood as illustrative examples. Further embodiments are envisaged. For example, in the first embodiment the unary data is added to the chunks in 32-bit portions. However, the size of the portion is not important, and the chunk structures shown in FIG. 5 could be adapted depending on the particular requirements of the processor that is to parse the chunks.

The second embodiment makes use of the Android neural networks architecture. However, the techniques described herein may be applied to different software architectures depending on the situation. For example, a different software architecture would be used in the context of a server-based implementation.

What is claimed is:

1. A method for use by a processing element, the method comprising:
    obtaining a plurality of variable length codes, wherein each variable length code has a first portion of variable length and a second portion,
    separating the variable length codes into first portions of the variable length codes and second portions of the variable length codes; and
    forming a processed stream in chunks using a set of control rules so that, for each chunk of the processed stream containing data from the first portions of the variable length codes, the data from the first portions forms a sub-stream within the chunk of the processed stream that has a size that is determined in accordance with the control rules.

2. A method according to claim 1, wherein the first portion of the variable length code is a unary portion and the second portion of the variable length code is a mantissa portion.

3. A method according to claim 2, wherein the mantissa portion of the variable length code is a truncated binary portion.

4. A method according to claim 2, wherein the unary portion of each variable length code represents a quotient of an original value represented by the variable length code.

5. A method according to claim 2, wherein the mantissa portion of each variable length code is a binary code of fixed length representing a remainder of a value represented by the variable length code.

6. A method according to claim 1, wherein the variable length code is a Golomb Rice code.

7. A method according to claim 1, wherein each chunk of the processed stream may include: data from the first portions of the variable length codes and data from the second portions of the variable length codes, data from the first portions of the variable length codes and not include data from the second portions of the variable length codes, or data from the second portions of the variable length codes and not include data from the first portions of the variable length codes.

8. A method according to claim 2, wherein the control rules are configured to sequentially determine a size of the unary sub-stream within each chunk.

9. A method according to claim 8, wherein the control rules are configured to determine a size of the size of the unary sub-stream in each chunk based on an amount of the unary portions of the variable length codes that remain to be added into the processed stream.

10. A method according to claim 9, wherein the processed stream is formed of cells of a predetermined length and wherein the amount of unary portions of the variable length codes that remain to be added into the processed stream is the number of bits of the unary portions of the variable length codes associated with a cell that remain to be added into the processed stream.

11. A method according to claim 1, wherein the processed stream is formed of cells of a predetermined length, wherein each cell of the processed stream has a header and a plurality of chunks, and wherein the header indicates a length of the cell and a length of the unary portions of the variable length codes within the cell.

12. A method according to claim 1, further comprising obtaining a second plurality of variable length codes, and
    separating the second plurality of variable length codes into first portions of the variable length codes and second portions of the variable length codes;
    wherein the step of forming a processed stream in chunks uses a set of control rules so that, for each chunk of the processed stream containing data from first portions of at least one of the first and second plurality of variable length codes, the flow control rules determine the number of first portions of the first plurality of variable length codes and the number of first portions of the second plurality of variable length codes are included in the chunk.

13. A method according to claim 12, wherein forming a processed stream includes maintaining a balance value that records a difference between a number of first portions of the first plurality of variable length codes that have been included in chunks and a number of first portions of the second plurality of variable length codes that have been included in chunks and the flow control rules are used to determine the number of first portions of the first plurality of variable length codes and the number of first portions of the second plurality of variable length codes included in a chunk based on the balance value.

14. A method according to claim 1, wherein the plurality of variable length codes represents weight values for use in a neural network.

15. A method according to claim 1, wherein the plurality of variable length codes represents values in an activation stream that is an output of a layer of a neural network.

16. A method of decoding a processed data stream, the method comprising:
    obtaining a processed data stream containing data relating to a plurality of variable length codes, wherein each variable length code has a first portion of variable length and a second portion and the processed stream is formed in chunks, wherein at least one chunk of the processed stream includes a sub-stream of data formed from first portions of the variable length codes; and
    identifying and extracting the sub-stream within the chunk of the processed data stream using a set of flow control rules.

17. A method according to claim 16, wherein each first portion of the variable length codes is encoded as unary data having a stop bit, the method further comprising:
    obtaining, from a plurality of chunks of the processed data, a plurality of identified and extracted sub-streams;
    converting each extracted sub-stream into an intermediate form representing a list of bit locations of stop bits within the sub-stream;
    combining a plurality of the converted sub-streams to form an enlarged list of bit locations; and
    measuring a distance between the stop bits of the in the enlarged list of bit locations to recover the values of the first portions of the variable length codes in the first stream.

18. A data processing system comprising a processing element and a storage, the storage storing code portions that, when executed by the processing element, cause the data processing system to:
    obtain a plurality of variable length codes, wherein each variable length code has a first portion of a variable length and a second portion,
    separate the variable length codes into first portions of the variable length codes and second portions of the variable length codes; and
    form a processed stream in chunks using a set of control rules so that, for each chunk of the processed stream containing data from the first portions of the variable length codes, the data from the first portions forms a sub-stream within the chunk of the processed stream that has a size that is determined in accordance with the control rules.

* * * * *